United States Patent
Zhong et al.

(10) Patent No.: US 6,365,916 B1
(45) Date of Patent: *Apr. 2, 2002

(54) HIGH APERTURE LCD WITH INSULATING COLOR FILTERS OVERLAPPING BUS LINES ON ACTIVE SUBSTRATE

(75) Inventors: John Z. Z. Zhong, Novi; Willem den Boer, Troy, both of MI (US)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/356,302

(22) Filed: Jul. 16, 1999

Related U.S. Application Data

(63) Continuation of application No. 08/908,803, filed on Aug. 8, 1997, now Pat. No. 5,994,721, and a continuation-in-part of application No. 08/671,376, filed on Jun. 27, 1996, which is a continuation-in-part of application No. 08/630,984, filed on Apr. 12, 1996, which is a continuation-in-part of application No. 08/470,271, filed on Jun. 6, 1995, now abandoned.

(51) Int. Cl.[7] .................... H01L 31/12; H01L 31/0392
(52) U.S. Cl. ........................... 257/59; 257/72; 257/89; 349/106
(58) Field of Search .................. 257/59, 72, 89, 257/440; 349/138, 106

(56) References Cited

U.S. PATENT DOCUMENTS

| | | |
|---|---|---|
| 4,470,667 A | 9/1984 | Okubo et al. |
| 4,654,117 A | 3/1987 | Aoki et al. |
| 4,704,559 A | 11/1987 | Suginoya et al. |
| 4,994,434 A * | 2/1991 | Hung et al. ............. 505/1 |
| 5,003,356 A | 3/1991 | Wakai et al. |
| 5,182,620 A | 1/1993 | Shimada et al. |
| 5,287,208 A | 2/1994 | Shimoto et al. |

(List continued on next page.)

FOREIGN PATENT DOCUMENTS

| | | |
|---|---|---|
| JP | 6-301057 A * | 10/1994 |
| JP | 10-133165 * | 5/1998 |

OTHER PUBLICATIONS

"Benzocyclobutene Dielectric Resins For Flat Panel Display Applications" by Radler, et al. Feb./1996.
"Invited Address: High–Aperture TFT Array Structures" by Suzuki, SID 94 Digest 1994 No month given.
"A 6.4–in–Diagonal Color TFT–LCD Module Suitable For Personal Information Tools" by Takeda, et al., SID 94 Digest 1994 No month.
"A High–Aperture–Ratio TFT–LCD With A Shield–Electrode Structure" by Ueda, SID 93 Digest 1993 No month.
"Optimisation of Very Small Pitch Active Matrix LCD For Projection" by Vignolle, et al., IEEE, 1991 No month.
"High–Aperture and Fault–Tolerant Pixel Structure For TFT–LCDs" by Kim, et al., SID 95 Digest 1995 No month.
"A High–Aperture–Ratio 3–in–Diagonal VGA a–Si Light Valve With Pixel/Data and Pixel/Gate Lines Overlapping" by Sakamoto, et al., SID 96 Digest 1996 No month.

Primary Examiner—Eddie Lee
Assistant Examiner—Allan R. Wilson
(74) Attorney, Agent, or Firm—Long, Aldridge & Norman, LLP

(57) ABSTRACT

A high aperture active matrix liquid crystal display (AMLCD) includes pixel electrodes in respective pixels which overlap adjacent address lines. The color filters are formed on the active substrate in a manner such that the filters also overlap the address lines and function as an insulating layer between the pixel electrodes and address lines in the areas of overlap. Accordingly, line-pixel capacitances are reduced and the resulting AMLCD is easier to manufacture. The total number of process step in manufacturing is reduced, and plate-to-plate (active to passive plate) alignment is much easier and less important.

11 Claims, 8 Drawing Sheets

U.S. PATENT DOCUMENTS

| | | | |
|---|---|---|---|
| 5,302,987 A | | 4/1994 | Kanemori et al. |
| 5,389,492 A | * | 2/1995 | Kokubo et al. ............. 430/191 |
| 5,396,262 A | * | 3/1995 | Hastings, III ................ 345/92 |
| 5,398,126 A | * | 3/1995 | Takao et al. .................. 359/68 |
| 5,414,278 A | | 5/1995 | Kobayashi et al. |
| 5,414,283 A | | 5/1995 | den Boer et al. |
| 5,414,547 A | | 5/1995 | Matsuo et al. |
| 5,418,635 A | | 5/1995 | Mitsui et al. ................. 359/70 |
| 5,419,991 A | | 5/1995 | Segawa |
| 5,422,293 A | * | 6/1995 | Konya ....................... 438/155 |
| 5,426,523 A | | 6/1995 | Shimada et al. |
| 5,445,898 A | * | 8/1995 | Budzilek et al. ............ 428/690 |
| 5,446,562 A | | 8/1995 | Sato |
| 5,453,857 A | | 9/1995 | Takahara |
| 5,457,553 A | | 10/1995 | Mori |
| 5,463,230 A | | 10/1995 | Negoto et al. |
| 5,463,484 A | * | 10/1995 | Brody ......................... 359/68 |
| 5,528,209 A | * | 6/1996 | Macdonald et al. ........ 333/247 |
| 5,532,180 A | | 7/1996 | den Boer et al. |
| 5,539,219 A | | 7/1996 | den Boer et al. |
| 5,568,289 A | | 10/1996 | Kishida ....................... 359/58 |
| 5,585,951 A | | 12/1996 | Noda et al. |
| 5,641,974 A | | 6/1997 | den Boer et al. |
| 5,650,358 A | | 7/1997 | Gu et al. |
| 5,757,445 A | * | 5/1998 | Vu et al. ...................... 349/45 |
| 5,818,550 A | * | 10/1998 | Kadota et al. ................ 349/43 |
| 5,847,720 A | * | 12/1998 | Dunand ........................ 347/1 |
| 5,886,365 A | | 3/1999 | Kouchi et al. ................ 257/59 |

* cited by examiner

HIGH APERTURE LCD WITH INSULATING COLOR FILTERS OVERLAPPING BUS LINES ON ACTIVE SUBSTRATE

This is a continuation of application Ser. No. 08/908,803, filed Aug. 8, 1997 now U.S. Pat. No. 5,994,721, which is a continuation-in-part of Ser. No. 08/630,984, filed Apr. 12, 1996; and which is a continuation-in-part of Ser. No. 08/470,271, filed Jun. 6, 1995 abandoned; and a continuation-in-part of Ser. No. 08/671,376, filed Jun. 27, 1996, all of which are incorporated herein by reference.

This invention relates to a liquid crystal display (LCD) having an increased pixel aperture ratio and different colored polymer filters. More particularly, this invention relates to a liquid crystal display including an array of TFTs wherein photo-imageable color filters having contact vias or apertures disposed therein are located on the active substrate between the address lines and pixel electrodes so that the pixel electrodes and color filters may both be permitted to overlap at least one of the row and column address lines without exposing the system to capacitive cross-talk, thereby providing an efficient and commercially improved high aperture LCD.

BACKGROUND OF THE INVENTION

Electronic matrix arrays find considerable application in X-ray image sensors and active matrix liquid crystal displays (AMLCDs). Such AMLCDs generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are liquid crystal display pixels or alternatively the memory cells or pixels of an electronically adjustable memory array or X-ray sensor array.

Typically, a switching or isolation device such as a diode or thin-film transistor (TFT) is associated with each array element or pixel. The isolation devices permit the individual pixels to be selectively addressed by the application of suitable potentials between respective pairs of the X and Y address lines. Thus, the TFTs act as switching elements for energizing or otherwise addressing corresponding pixel electrodes.

Amorphous silicon (a-Si) TFTs have found wide usage for isolation devices in liquid crystal display (LCD) arrays. Structurally, TFTs generally include substantially co-planar source and drain electrodes, a thin-film semiconductor material (e.g. a-Si) disposed between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted. Thus, by controlling the voltage to the gate and drain electrodes, the pixels of an AMLCD may be switched on and off in a known manner.

Typically, pixel aperture ratios (i.e. pixel openings) in non-overlapping AMLCDs are only about 50% or less. As a result, either display luminance is limited or backlight power consumption is excessive, thereby precluding or limiting use in certain applications. Thus, it is known in the art that it is desirable to increase the pixel aperture ratio or pixel opening size of LCDs to as high a value as possible so as to circumvent these problems. The higher the pixel aperture ratio (or pixel opening size) of a display, for example, the higher the display transmission. Thus, by increasing the pixel aperture ratio of a display, transmission may be increased using the same backlight power, or alternatively, the backlight power consumption may be is reduced while maintaining the same display luminance.

It is known to overlap pixel electrodes over address lines in order to increase the pixel aperture ratio. For example, "High-Aperture TFT Array Structures" by K. Suzuki discusses an LCD having an ITO shield plane configuration having a pixel aperture ratio of 40% and pixel electrodes which overlap signal bus lines. An ITO pattern in Suzuki located between the pixel electrodes and the signal lines functions as a ground plane so as to reduce coupling capacitance between the signal lines and the pixel electrode. Unfortunately, it is not always desirable to have a shield electrode disposed along the length of the signal lines as in Suzuki due to production and cost considerations. The disposition of the shield layer as described by Suzuki requires extra processing steps and thus presents yield problems. Accordingly, there exists a need in the art for a color LCD with an increased pixel aperture ratio which does not require an ITO shield plane structure to be disposed between the signal lines and pixel electrode.

It is old and well-known to make TFT arrays for LCDs wherein address lines and overlapping pixel electrodes are insulated from one another by an insulating layer. For example, see U.S. Pat. Nos. 5,055,899; 5,182,620; 5,414,547; 5,426,523; 5,446,562; 5,453,857; and 5,457,553.

U.S. Pat. No. 5,182,620 discloses an AMLCD including pixel electrodes which at least partially overlay the address lines and additional capacitor lines thereby achieving a larger numerical aperture for the display. The pixel electrodes are insulated from the address lines which they overlap by an insulating layer formed of silicon oxide or silicon nitride. Unfortunately, the method of making this display as well as the resulting structure are less than desirable because: (i) chemical vapor deposition (CVD) is required to deposit the silicon oxide or silicon nitride insulating film; (ii) silicon oxide and silicon nitride are not photo-imageable (i.e. contact holes or vias must be formed in such insulating layers by way of etching); and/or (iii) the dielectric constants of these materials are too high and thereby render the LCD susceptible to cross-talk problems. Still further, the '620 patent does not discuss or contemplate color filter issues. As a result of these problems, the manufacturing process is both expensive and requires more steps than would be otherwise desirable. For example, in order to etch the contact holes in an insulating layer, an additional photoresist coating step is required and the user must be concerned about layers underneath the insulating layer during etching. With respect to CVD, this is a deposition process requiring expensive equipment. Furthermore, if the color filters are on the passive substrate, as they typically are, alignment of the active and passive plates is difficult and requires expensive equipment and expertise.

In the prior art, color filters in active matrix liquid crystal displays (AMLCDs) are typically located on the substrate (the passive plate or substrate) which opposes the active matrix substrate. In other words, the color filters and TFTs (or diodes) are typically located on different substrates, on opposite sides of the liquid crystal (LC) layer [e.g. see U.S. Pat. No. 5,499,126]. Black matrix formation is also typically provided on the color filter substrate. The provisions of the black matrix and color filters on the substrate opposite the active matrix is, of course, costly, time consuming, and requires numerous manufacturing steps. As discussed above, this also requires difficult and time consuming alignment steps.

The LCD structure disclosed in U.S. Pat. No. 5,641,974 utilizes a transparent polymer insulating layer on the active substrate to provide isolation between address lines and overlapping pixel electrodes. While this design work well and achieves superior results, it unfortunately, in practice, requires each of: (i) providing the transparent polymer insulating layer on the active substrate; (ii) providing color filters on the opposite substrate; (iii) providing a black matrix on the color filter substrate; (iv) very accurate plate-to-plate (i.e. substrate-to-substrate) alignment; and (v) the process steps required for (ii)–(iv) above.

It is apparent from the above that there exists a need in the art for an improved high aperture AMLCD design, and method of manufacturing same, which (i) reduces the number of total manufacturing process steps required; (ii) eliminates the need for the combination of (a) the optically transparent insulating layer sandwiched between the address lines and pixel electrodes, and (b) the color filters; (iii) reduces the need for the black matrix on the substrate opposite the active substrate; (iv) provides for a high pixel aperture ratio; and/or (v) reduces the accuracy required in plate-to-plate alignment (i.e. eliminates the need for sophisticated alignment machines).

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing a high aperture color LCD including color filters, the display comprising:

first and second substrates;

a liquid crystal layer sandwiched between the first and second substrates;

first and second different colored pixels, said first pixel including on said first substrate a first pixel electrode, a first insulating color filter, and a first thin film transistor (TFT), and said second pixel including on the first substrate a second pixel electrode, a second insulating color filter, and a second TFT, wherein said first and second color filters are differently colored;

the first and second pixel electrodes overlapping with corresponding address lines in communication with TFTs so as to define a high aperture display, the overlapping forming areas of overlap;

the first insulating color filter being at least partially disposed in an area of overlap in the first pixel, the first color filter having a dielectric constant of less than about 5.0 and having a first contact hole defined therein that allows the first pixel electrode to be electrically connected to the first TFT; and said second insulating color filter being at least partially disposed in an area of overlap in the second pixel, the second color filter having a dielectric constant less than about 5.0 and having a second contact hole defined therein that allows the second pixel electrode to be electrically connected to the second TFT.

In certain embodiments, each of the first and second color filters are of a photo-imageable material that includes a color dye or pigment.

In certain embodiments, the LCD includes arrays of only two colored pixels, while in other embodiments the display may include arrays of three differently colored pixels, or four differently colored pixels.

Surprisingly, it has been found that the thickness of the metal pixel electrode layers (e.g. ITO) should be from about 300 Å–900 Å (preferably about 600 Å) in this invention in order to reduce the interface stress between the pixel electrodes (e.g. ITO) and the color filters.

This invention further fulfills the above-described needs in the art by providing a method of making a color LCD having insulating color filters, the method comprising the steps of:

providing first and second substrates;

providing a liquid crystal material;

forming an array of isolation switching elements on the first substrate and a plurality of address lines in communication with the isolation switching elements;

depositing a first resist color filter layer on the first substrate over top of the address lines and the switching elements;

photo-imaging the first resist color filter layer so as to pattern it into a first array on the first substrate so that color filters in the first array are of a first color and overlap at least a portion of at least one address line;

depositing a second resist color filter layer of a second color over top of the first array of color filters;

photo-imaging the second resist color filter layer so as to pattern it into a second array so that color filters in the second array overlap at least a portion of at least one address line;

forming contact holes in color filters in each of the first and second arrays;

depositing a conductive pixel electrode layer over top of the first and second arrays of color filters; and patterning the electrode layer so as to form an array of substantially transparent pixel electrodes wherein pixel electrodes in the array overlap address lines which are also overlapped by color filters so that the color filters act as insulators between the pixel electrodes and the address lines in the areas of overlap, wherein each of the pixel electrodes is in electrical communication with a corresponding switching element through one of the contact holes.

In certain preferred embodiments, each of the color filters has a dielectric constant less than or equal to about 4.0 so as to reduce cross-talk and coupling capacitance in the areas of overlap.

This invention will now be described with reference to certain embodiments thereof as illustrated in the following drawings.

IN THE DRAWINGS

FIG. 1 is a top view of an AMLCD active plate according to one embodiment of this invention, this figure illustrating a plurality of different colored pixels wherein the illustrated pixel electrodes 3 and corresponding color filters 101–104 are overlapping surrounding and proximate row and column address lines along their respective lengths throughout the pixel area so as to increase the pixel aperture ratio of the display.

Figure 1:
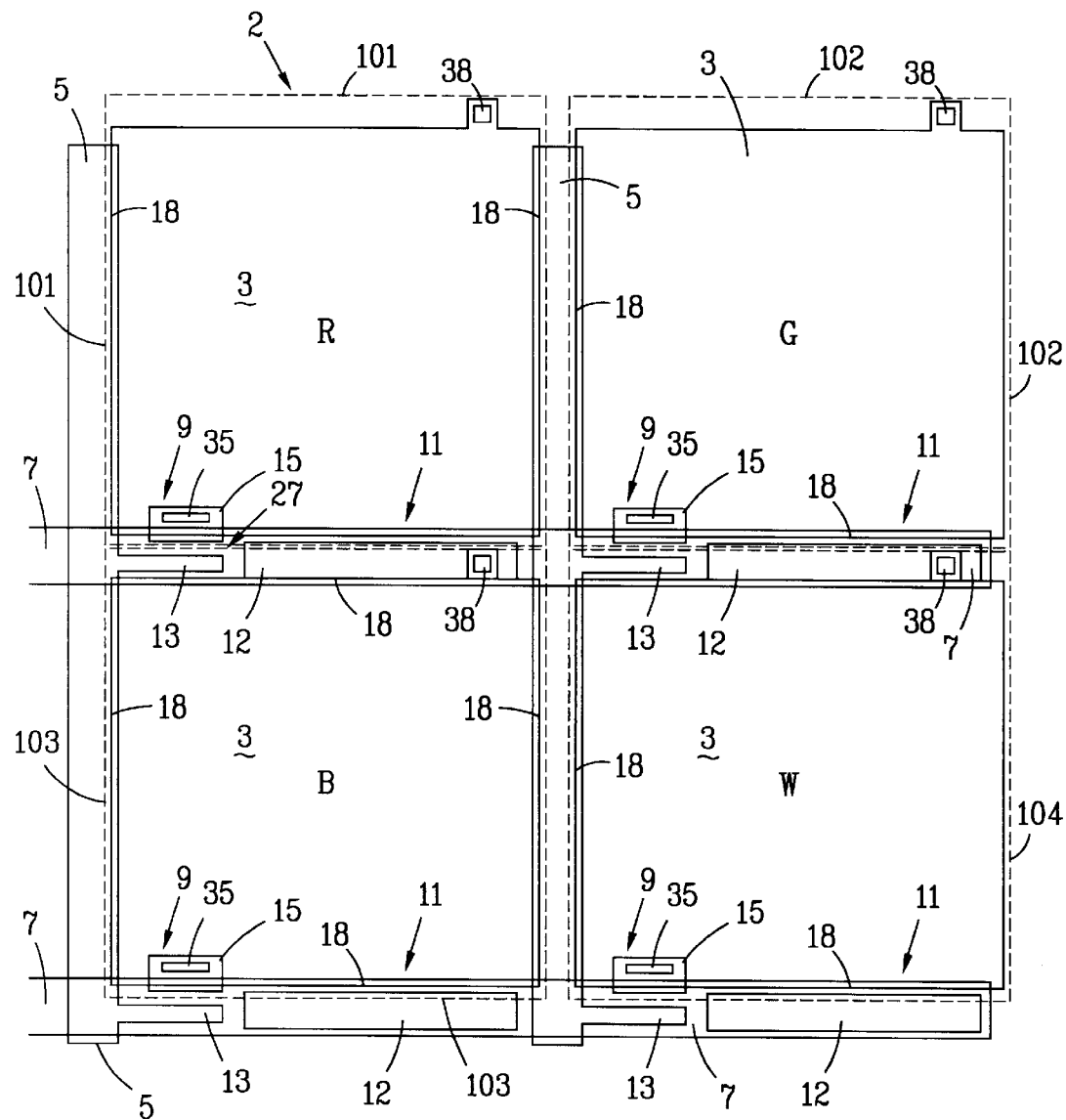
Figure 6A:
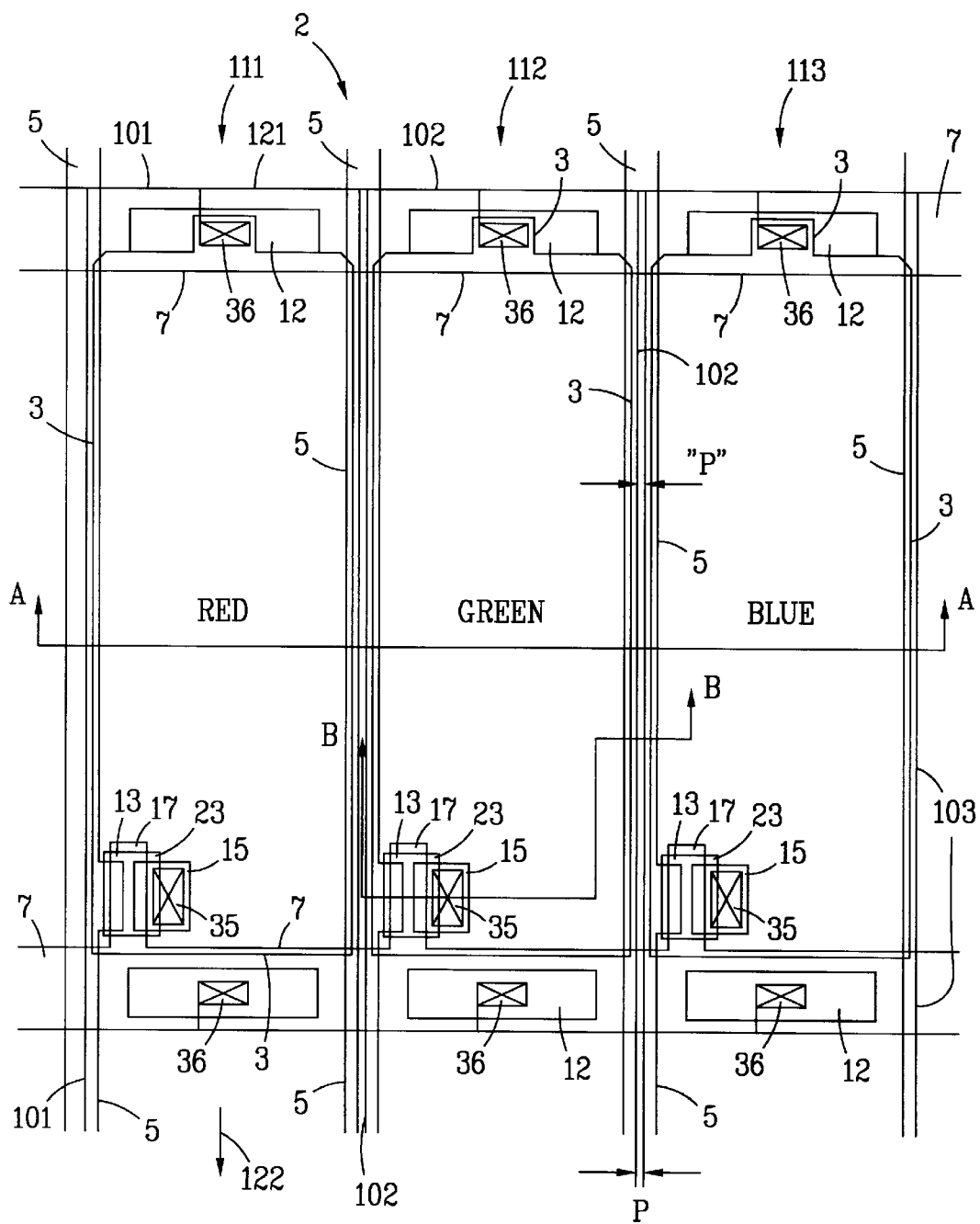
FIG. 6(a) is a top view of an AMLCD active plate according to another embodiment of this invention.
Figure 6B:
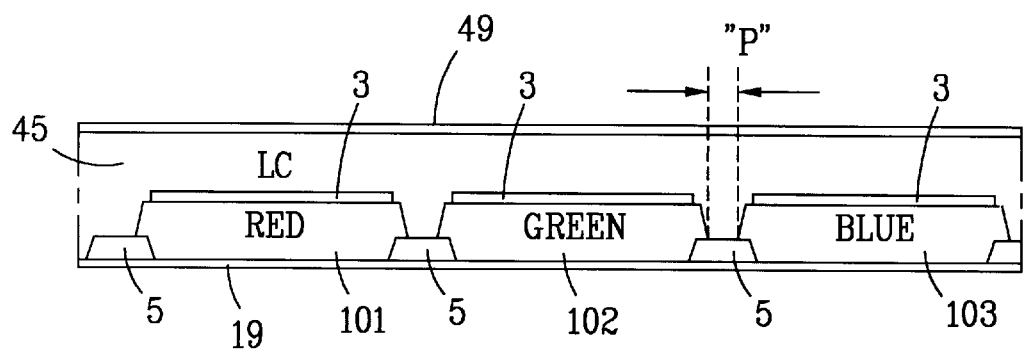
FIG. 6(b) is a side cross-sectional view of the FIG. 6(a) AMLCD, along A—A.
Figure 6C:
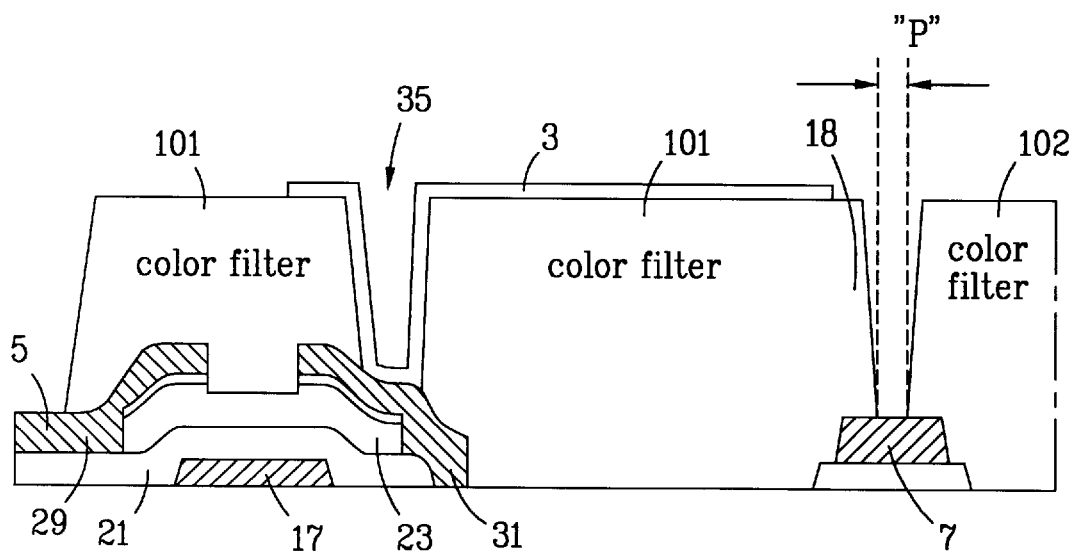

FIG. 6(c) is a side cross-sectional view of a portion of the display according to the FIG. 6(a) along B—B, this embodiment illustrating the color filters and pixel electrodes overlapping respective address lines and TFTs on the active matrix plate, this embodiment differing from the previously illustrated FIG. 1 embodiment in that the gate electrode in this embodiment protrudes at a 90° angle from the gate line so as to be parallel to the drain line, in each pixel.

FIGS. 7–10 are side elevational cross-sectional views illustrating how the active matrix in the display of FIG. 1 is manufactured according to an embodiment of this invention.

Figure 11:
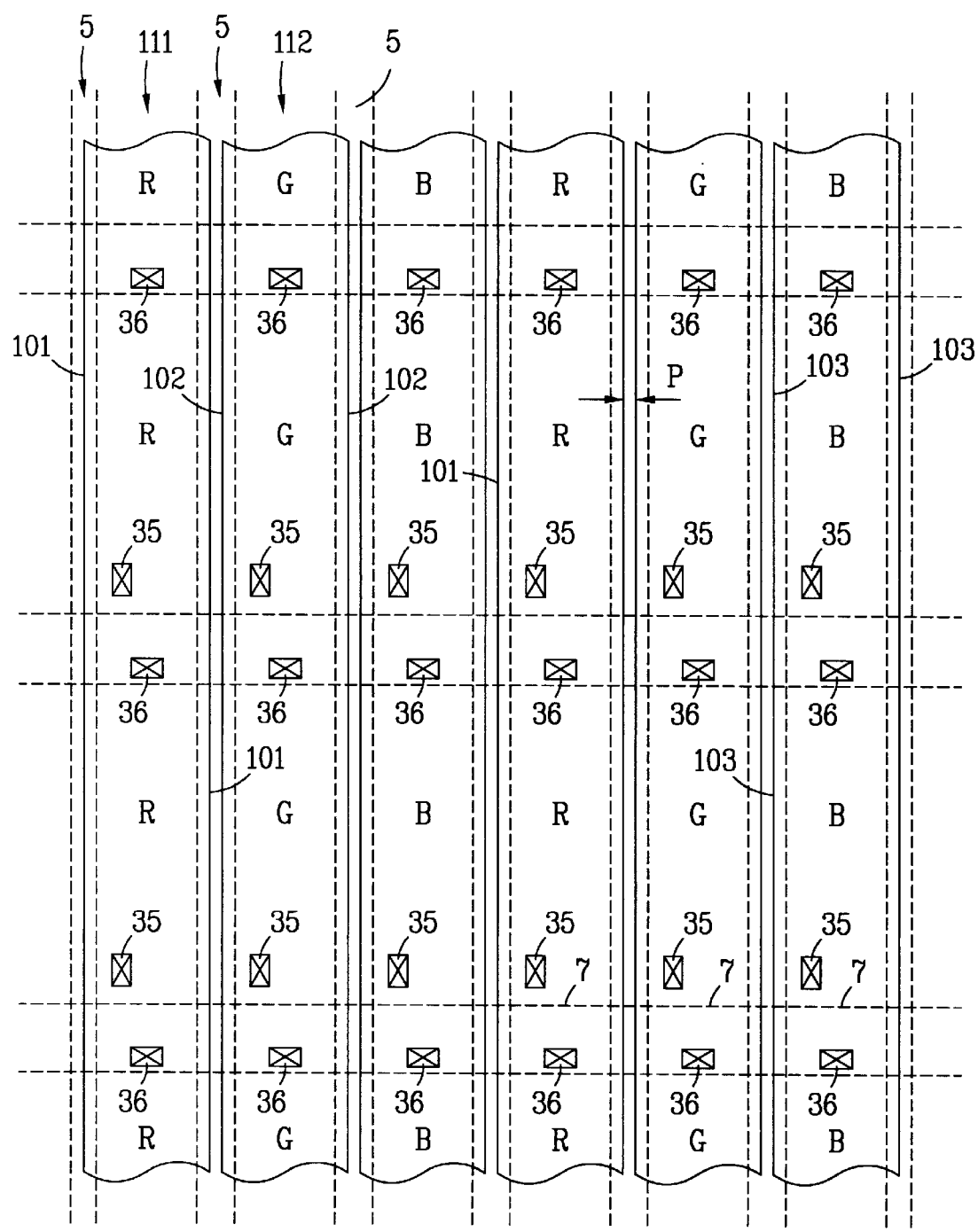

FIG. 11 is a top view of an array of colored pixels, illustrating the array of color filter strips extending across the viewing area according to the FIG. 6 embodiment.

DETAILED DESCRIPTION OF CERTAIN EMBODIMENTS OF THIS INVENTION

Referring now more particularly to the accompanying drawings in which like reference numerals indicate like is parts throughout the several views.

FIG. 1 is a top view of four different colored pixels (red, green, blue, and white) in an array on the active plate of an active matrix liquid crystal display (AMLCD) 2 according to an embodiment of this invention. This particular portion of the display includes an array pixel electrodes 3, drain address lines 5, gate address lines 7, an array of four thin-film transistors (TFTs) 9, auxiliary storage capacitors 11, and finally insulating color filters 101–103 (the peripheries of these color filters are illustrated in broken or dotted lines) and optional substantially clear polymer layer 104. The color layer 104 defines white pixel(s). Each storage capacitor 11 is defined on one side by a gate line 7 and on the other side by an independent storage capacitor electrode 12. Storage capacitor electrodes 12 are formed along with drain electrodes 13.

For example, the number of total process steps on the active and passive plates is reduced, and the active to passive plate alignment is much easier and less important. In some embodiments, up to three or more photo steps in manufacturing can be eliminated.

As shown, the longitudinally extending edges of each pixel electrode 3 and each color filter 101–103 at least partially overlap both drain lines 5 and gate lines 7, respectively, along edges thereof so as to increase the pixel aperture ratio (or pixel opening size) of the color AMLCD. The optically clear layer 104 in each white pixel also overlaps the address lines. Optionally, only one of the gate lines and drain lines may be at least partially overlapped by the pixel electrode and color filter of a given pixel.

The red, green, and blue pixels are provided with color filters 101–103, respectively, while the white pixel may or may not be provided with clear layer 104.

The areas of overlap between the address lines (e.g. gate and/or drain) and the overlapping pixel electrodes and color filters are referred to as overlap areas 18. In each of these areas 18 of overlap between the (i) address line(s) 5, 7, and (ii) pixel electrodes 3 and color filters 101–103 (and insulating layer 104), a pixel-line (PL) capacitor is defined by an electrode 3 on one side and the overlapped conductive address line 5, 7 on the other side. The dielectric disposed between the opposing electrodes of these PL capacitors is represented by the insulating color filters 101–103 (e.g. see FIGS. 4 and 6) in the colored pixels and layer 104 in white pixels. The parasitic capacitance $C_{PL}$ of these capacitors is defined by the known equation:

$$C_{PL} = \frac{\epsilon \cdot \epsilon_0 \cdot A}{d}$$

where "d" is the thickness of the color filter layer, $\epsilon$ is the dielectric constant of the color filter, $\epsilon_0$ is the constant $8.85 \times 10^{-14}$ F/cm (permitivity in vacuum), and "A" is the area of the PL capacitor in the overlap area 18 at issue. The fringing capacitance may also be taken into consideration in a known manner. Also, according to certain other embodiments, the color filters 101–103, and layer 104, are of a material and thickness so that $C_{PL}$ is less than or equal to about 0.01 pF for a display with a pixel pitch reference of about 150 $\mu$m. When the pixel pitch is smaller than this reference of 150 $\mu$m, $C_{PL}$ should be scaled to a lower value as well because overlap area(s) 18 are smaller. Additionally, the pixel aperture ratio of the LCD decreases as the pixel pitch decreases, as is known in the art. The pixel pitch of AMLCD 2 may be from about 40 to 5,000 $\mu$m according to certain embodiments of this invention. The pixel pitch, as known in the art, is the distance between centers of adjacent pixels in the array.

An important aspect of this invention is the fact that, as illustrated in FIG. 1, the color filters 101–103 (and layer 104) are provided on the active matrix substrate (i.e. on the active plate), and act as insulators in these capacitors between overlapping pixel electrodes 3 and address lines. Accordingly, the color filters 101–103 and layer 104 are patterned on the active plate so that they also overlap the corresponding address lines so as to insulate them from the overlapping pixel electrodes 3. The color filters 101–103 and layer 104 are patterned on the active plate so that different color filters are spaced from one another, between adjacent pixels, by from about 0.5 to 2.0 $\mu$m in certain embodiments. Thus, a gap "P" or space of this width is provided over address lines between pixels, the gap "P" defined as the distance between filters. This design simplifies the manufacturing process for forming the AMLCDs, and results in a more efficient display and method of manufacture.

As illustrated in FIG. 1, color filter 101 is a red color filter, color filter 102 is a green color filter, color filter 103 is a blue color filter, and layer 104 is a substantially clear material as in U.S. Pat. No. 5,641,974). Each of color filters 101–103 is of a photo-imageable material, with a respective color filter pigment added thereto. Layer 104 may also be photoimageable. The colors of the respective filters 101–103 need not be limited to these particular colors, but may also assume different colors in alternative embodiments of this invention, as is known in the art. Alternatively, non-photo-imageable material may be used, with pigment or dye, as the color filters 101–103 and layer 104.

Figure 2:
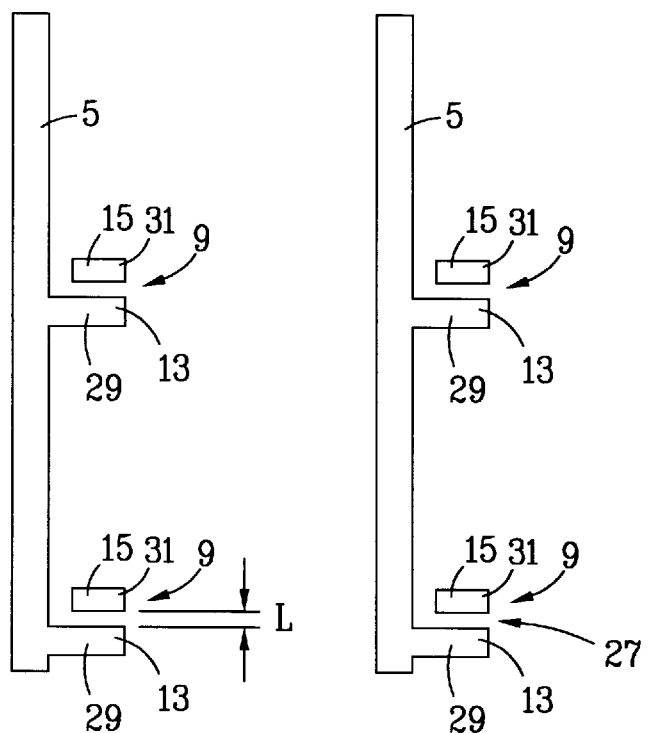
FIG. 2 is a top view of the column or drain address lines and corresponding drain electrodes of the AMLCD of FIG. 1, this figure also illustrating the TFT source electrodes disposed adjacent the drain electrodes so as to define the respective TFT channels.

FIG. 2 is a top view of drain address lines 5 of the FIG. 1 AMLCD 2 illustrating how extensions of address lines 5 form drain electrodes 13 of TFTs 9. Each TFT 9 in the array includes source electrode 15, drain electrode 13, and corresponding gate electrode 17. Gate electrode 17 of each TFT 9 is formed by the corresponding gate address line 7 adjacent the TFT according to certain embodiments of this invention. In other embodiments (e.g. see FIG. 6), gate electrode 17 for each TFT may be formed by a branch extending substantially perpendicular to the gate address line. Herein, a source electrode is defined as the TFT electrode that is in communication with the pixel electrode.

Figure 3:
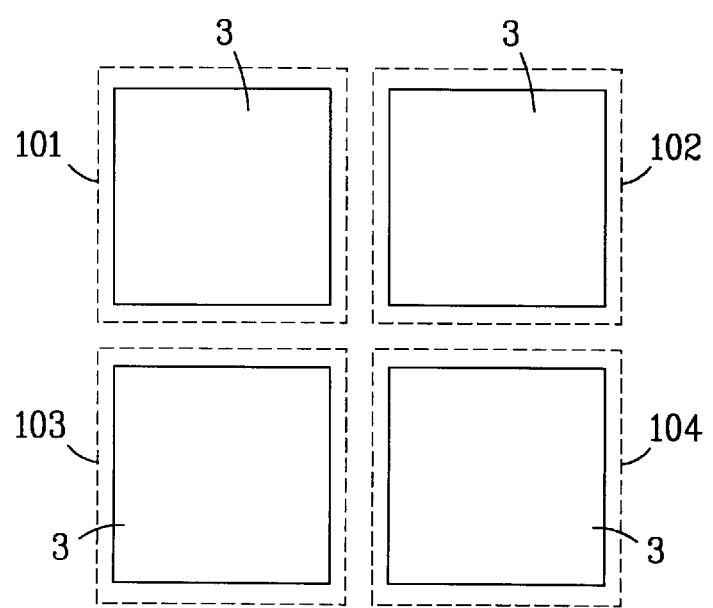
FIG. 3 is a top view of the pixel electrodes of FIG. 1 and the corresponding insulating color filters, except for electrode extensions.

FIG. 3 is a top view illustrating pixel electrodes 3 in solid lines (absent their extension portions 38) and the corresponding color filters 101–103 in broken lines. FIGS. 2–3 are provided so that FIG. 1 may be more easily interpreted. As shown in FIG. 3, the exterior periphery of each color filter 101–103 extends beyond the outer periphery of the corresponding pixel electrode 3, so that each color filter 101–103 (and layer 104) defines a greater surface area than the corresponding pixel electrode 3. As a result of this difference in surface area, the layers 101–104 act as superior insulators, each with a thickness of from about 1.0–3.0 $\mu$m in the areas 18 of overlap between the pixel electrodes and the corresponding address lines, so as to reduce cross-talk and the coupling capacitance between the pixel electrodes 3 and overlapped address line(s) in the high aperture LCD.

Figure 4:
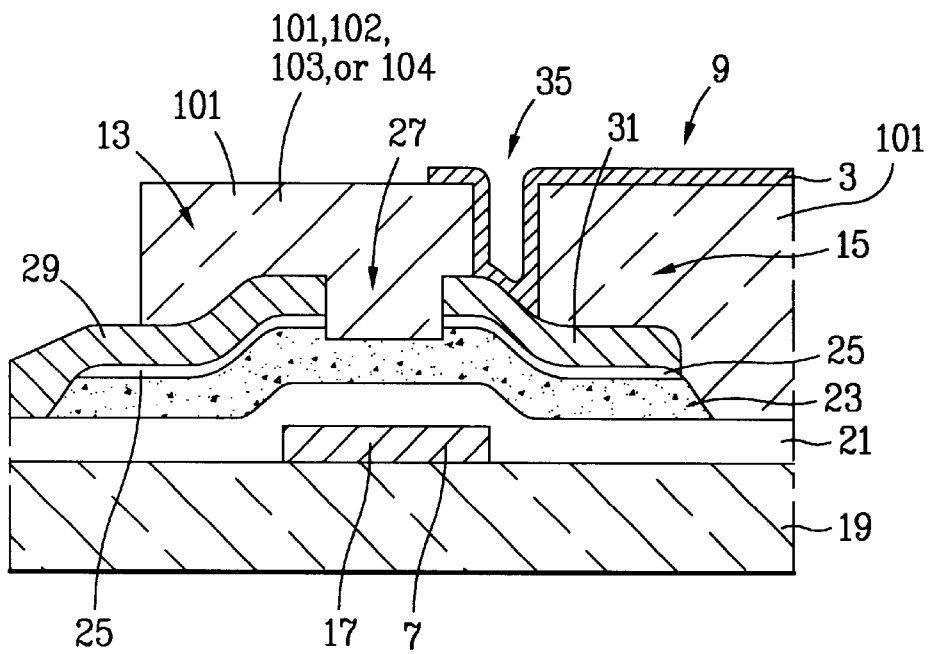
FIG. 4 is a side elevational cross-sectional view of a linear shaped TFT and corresponding color filter and pixel electrode of FIGS. 1–3.

FIG. 4 is a side elevational cross-sectional view of a single TFT 9 (in a red pixel) in the TFT array of the FIG. 1 AMLCD 2, with each TFT 9 in the array being substantially the same as the one shown in FIG. 4 according to certain embodiments. Each TFT 9 has a channel length "L" defined by the gap 27 between source electrode 15 and drain electrode 13. Source electrode 15 is connected to pixel electrode 3 by way of via or contact hole 35 defined in red color filter 101 so as to permit TFT 9 to act as an isolating switching element and selectively energize a corresponding pixel/pixel electrode in AMLCD 2 in order to provide red image data to a viewer. An array of TFTs 9 is provided as illustrated in FIG. 1 for the AMLCD, with the color filters being different colors in different color pixels. Alternatively, diodes may be used as isolating switching elements instead of TFTs.

Each TFT 9 structure includes substantially transparent active substrate 19 (e.g. made of glass), metal gate electrode 17, gate insulating layer or film 21, semiconductor layer 23 (e.g. intrinsic amorphous silicon), doped semiconductor contact layer 25, drain electrode 13, source electrode 15, insulating color filter or layer 101, 102, 103, or 104, and a corresponding pixel electrode 3. TFT channel 27 of length "L" is defined between source 15 and drain 13.

Because the color filters (and layer 104) are patterned in different colored arrays on the active plate, the filters, as shown in FIG. 4, do not entirely overlap the whole drain electrode 13, but instead only overlap a substantial portion (e.g. greater than about 25% of the drain electrode) thereof along with the TFT channel 27 so as to insulate them from electrode 3 that also does not overlap the entire drain electrode. As shown in FIG. 4, the pixel electrode 3 in each pixel does not even overlap the drain electrode in this embodiment, although it may in some embodiments. Optionally, in certain embodiments, the filters 101–103, and layer 104, may overlap the entire TFT structure in each pixel.

If the TFT structure illustrated in FIG. 4 was for the red pixel illustrated in FIG. 1, then the insulating layer 101 between the pixel electrode 3 and the TFT and address lines would be red insulating color filter 101. Likewise, if the TFT structure illustrated in FIG. 4 was for the green pixel of FIG. 1, then the insulating layer would be represented by color filter 102, and if the TFT structure was for the blue pixel, then the insulating layer would be represented by blue color filter 103. If FIG. 4 was for a white pixel, the insulating layer 104 would be clear. It is pointed out that the color filters 101, 102, 103, (and layer 104) cover the channel 27 of the TFT, but only partially cover or overlap the corresponding drain electrode 13, 29 in certain embodiments.

As illustrated in FIG. 4, drain electrode 13 is made up of drain metal layer 29 (e.g. Mo) which is deposited on active substrate 19 over top of doped contact layer 25. Contact film or layer 25 may be, for example, amorphous silicon doped with an impurity such as phosphorous (i.e. n+ a-Si) and is sandwiched between semiconductor layer 23 and drain metal layer 29. Source electrode 15 includes doped semiconductor contact layer 25 and source metal layer 31. Metal layers 29 and 31 may be of the same metal and deposited and patterned together according to certain embodiments of this invention. Alternatively, layer 29 may be deposited and patterned separately from layer 31 so that drain metal layer is of one metal (e.g. Mo) and source metal layer 31 is of another metal (e.g. Cr) across the array.

FIGS. 6(*a*), 6(*b*), 6(*c*), and 11 illustrate AMLCD 2 according to another embodiment of this invention [FIG. 11 does not show the pixel electrodes 3]. This embodiment differs from the FIG. 1 embodiment in that across substantially the entire display viewing area on the active plate, the columns (or rows) of pixels between respective drain address lines 5 extending in one axial direction are each of a single color. For example, as illustrated in FIGS. 6(*a*) and 11, column 111 of pixels on the display area includes only red pixels with a single red color filter strip 101, while column 112 of pixels includes only green pixels with a single green filter strip 102, and column 113 includes only blue pixels with a single blue filter strip 103. Therefore, red color filter material 1 may be deposited and patterned on the active substrate into a plurality or array of elongated strips which correspond to the red pixel columns, thereby eliminating the need to pattern each red pixel filter individually as a square. Therefore, because the materials 101–104 are only patterned into elongated columns (or rows) extending in one axial direction, gaps "P" exist over top of, and along the length of, one set of address lines, but not the other set which remains covered for the most part. The green and blue color filter materials 102–103 are also patterned into columns as illustrated.

As illustrated in FIGS. 6(*a*) and 11, gaps "P" between adjacent different colored filter materials are present along substantially the entire lengths of the column lines (drain lines 5), while gate address lines 7 are for the most part covered up entirely with the insulating color filter materials, except for very small areas proximate the drain lines 5 where the gap "P" exists between adjacent color filters.

Referring to FIG. 6(*a*), each pixel also includes the storage capacitor including contact hole 36 through which the corresponding pixel electrode 3 contacts the upper molybdenum electrode 12 of the storage capacitor. The bottom electrode of each storage capacitor is formed by a gate line 7. FIG. 6(*a*) illustrates only three pixels, red, green, and blue, proximate one edge 121 of the viewing area. As will be appreciated by those of skill in the art, hundreds, if not thousands, of different colored pixels extended across the entire viewing area, with each material 101–104 extending and being patterned into an array of strips across same. For example, red color filter 101 that is illustrated in FIG. 6(*a*) extends downwardly in direction 122 across the entire display viewing area (see FIG. 11), as do filter strips 102 and 103. If white pixels are present, clear layer 104 strips will also be included. Also illustrated in FIG. 6(a) at the bottom of each of the three pixels, are the storage capacitors which correspond to the colored pixels below those illustrated.

Another difference between the FIG. 6(a)–6(c) embodiment relative to the FIG. 1 embodiment, is that in the FIG. 6(a)–6(c) embodiment the gate electrode 17 of each TFT is formed as a perpendicular extension which protrudes from a gate line 7. Meanwhile, the drain electrode 13 of each TFT is formed as a perpendicular extension which protrudes from the edge of a respective drain address line 5. Pixel electrodes 3 contact source electrodes 15 through contact holes 35 which are illustrated in FIGS. 6(a) and 11 with "X" sectioning.

FIG. 6(b) is a side cross-sectional view of the active plate of FIG. 6(a), taken along viewing line A—A with FIG. 6(b) also illustrating liquid crystal layer 45 and the common electrode 49 which is disposed on the passive substrate 51.

FIG. 6(c) is a side cross-sectional view of the active plate of FIG. 6(a), taken along viewing line B—B.

Referring to FIGS. 1–11, color filters 101–103, and clear layer 104, each have a dielectric constant less than or equal to about 5.0 (preferably less than or equal to about 4.0, and even more preferably less than or equal to about 3.0) according to certain embodiments of this invention, and are deposited and patterned on active substrate 19 so as to at least partially cover the TFTs 9 and at least one of address lines 5 and 7 in overlap areas. These low dielectric constant values have been found to reduce cross-talk and reduce line-pixel capacitance values, both of which are desirable results. For example, the red color filters 101 may be formed on substrate 19 by depositing red color filter layer 101 and thereafter patterning same via known photolithography and/or etching so as to form the various red color filter strips or squares 101 across the substrate in the red pixel areas. Thereafter the green color filter strips or squares 102 may be formed by depositing a layer of the green color filter material on substrate 19 and thereafter patterning same via photo-imaging or the like so as to form the array of green color filter strips or squares 102 on the substrate. The blue color filter strips or squares may be formed in a similar manner as may the array of clear insulators 104.

Each color filter 101–103 may be formed of a color dye or pigment inclusive photo-imageable material such as a filter material available from Fuji [Olin Macroelectronics Materials, Rhode Island] known as Color Mosaic™, red, green, and blue, product Nos. CR-6200L, CG-6030L, and CB-6030L respectively. The refractive index of each color filter is, for example, for the red color filter 1.60, for the green 1.52, and for the blue 1.83. Generally, the refractive index of each color filter 101–103 is from about 1.50 to 2.00. The photo-imageable nature of the color filters 101–103, and clear layer 104, permits vias or contact holes 35 to be formed therein and also simultaneously allows the color filters to be patterned on the active substrate. Optionally, vias or contacts holes 36 may also be simultaneously formed in the color filters so as to allow formation of the storage capacitors.

Each color filter 101–103 (and material 104) is of a material which has a dielectric constant $\epsilon$ less than or equal to about 5.0 according to certain embodiments of this invention [at room temperature and about 1 kHz as known in the art]. In certain preferred embodiments, each color filter layer has a dielectric constant less than or equal to about 4.0 (even more preferably less than or equal to about 3.0). In certain preferred embodiments, the clear layer 104 has a dielectric constant $\epsilon$ of about 2.7 and may be made of a transparent photo-imageable type of Benzocyclobutene (BCB), for the purpose of reducing capacitive cross-talk (or capacitive coupling) between the pixel electrodes and the address lines in overlap areas 18. Alternatively, the layer 104 may be made of Fuji Clear™. Each color filter has a relatively low dielectric constant and/or a relatively high thickness for the specific purpose of reducing $C_{PL}$ in the overlap areas. Alternatively, other photo-imageable dye inclusive materials having such low dielectric constants may be utilized for color filters 101–103.

Following the deposition and patterning of the color filters 101–103, and layer 104, on active plate 19 over top of the TFTs 9 and address lines 5, 7, vias 35 are formed in the color filters 101–103, and layer 104, by way of either photo-imaging, wet etching, or dry etching in other embodiments. The color filters and layer 104, in photo-imageable embodiments, act as negative working resist layers so that UV exposed areas remain on the substrate and areas unexposed to UV during photo-imaging are removed during developing. Optionally, vias or contact holes 36 may also be formed at this time. Following the forming of the vias or contact holes in the different patterned filters 101–103, and layer 104, substantially transparent pixel electrodes 3 (e.g. made of indium tin oxide or ITO) are deposited and patterned over the color filters 101–103 and layer 104 on the is active plate so that each pixel electrode 3 contacts the corresponding source metal layer 31 of the corresponding TFT 9 through a via 35 as illustrated in FIGS. 4 and 6.

The thickness of each color filter 101–103 (and layer 104) may vary according to certain embodiments of this invention. For example, red color filters 101 may be thinner than green color filters 102 or vice versa, with blue 103 being thicker than both the red and green filters. In preferred embodiments, the thickness "d" of each color filter ranges from at least about 1.0 μm in overlap areas 18. In other embodiments, the thickness "d" of each color filter is from about 1.0 to 3.0 μm, and preferably from about 1.5–2.5 μm. The thickness of all of the strips or layers 101–104 may be substantially the same in certain embodiments.

Because of the low dielectric constant $\epsilon$ and/or relatively high thickness of each color filter 101–103 and layers 104, the capacitive cross-talk problems of the prior art resulting from overly high $C_{PL}$ values are substantially reduced in overlap areas 18 where the pixel electrodes 3 overlap the address lines and/or TFTs. Meanwhile, due to the certain overlapping between address line(s) and color filters/pixel electrodes, the possible liquid crystal disclinations at the pixel edges will be substantially overcome. Furthermore, the manufacturing of these displays is improved (i.e. the total number and/or complexity of the steps is reduced), as the number of total process steps on both active and passive plates is reduced. Also, it is easier to align the opposing plates. Because the color filters are disposed between the pixel electrodes and the address lines in the overlap areas 18, the capacitive cross-talk problems of the prior art are substantially reduced or eliminated, and increased pixel openings are achieved without sacrificing display performance (pixel isolation).

Pixel opening sizes or the pixel aperture ratio of AMLCD 2 is at least about 65% (preferably from about 68% to 80%) according to certain embodiments of this invention when the pixel pitch is a reference of about 150 μm. The pixel aperture ratio will, of course, vary depending upon the pixel pitch of the display (pixel pitch is from about 40–500 μm may be used). Pixel electrodes 3 overlap address lines 5 and/or 7 along the edges thereof as shown in FIG. 1 by an amount of up to about 3.0 μm. In certain preferred embodiments of this invention, the overlap 18 of electrodes 3 over the edges of the address lines is designed to be from about 2 to 3 μm, with the end result after over-etching being at least about 0.5 µm. According to certain other embodiments of this invention, the amount of overlap may be designed to be from about 2–3 µm, with the resulting post-processing overlap being from about 0.1 to 2.0 µm. The overlap amount between the address lines and pixel electrodes may be adjusted in accordance with different LCD applications and pixel pitch sizes as would be appreciated by those of skill in the art.

With regard to the overlap amount of the color filters 101–103, and layer 104, over the address lines 5, 7, the color filters 101–103, and layer 104, overlap the address lines to a greater degree than do the corresponding pixel electrodes 3. For example, color filter 101 in the red pixel of FIG. 1 may overlap a corresponding address line (5 and/or 7) by about 1.0 µm while the pixel electrode 3 of that pixel only overlaps the same address line by about 0.5 µm. The patterned substantially co-planar arrays of filters 101–103 and layer 104 are all characterized by these traits.

In certain situations, after etching and processing, pixel electrodes 3 may not overlap the address lines at all while the filters do still overlap the line(s) according to certain embodiments of this invention, although some overlap by both is preferred. When no overlap by the pixel electrodes 3 occurs, the parasitic capacitance $C_{PL}$ between the address lines and the adjacent pixel electrodes 3 is still minimized or reduced due to the insulating function of the color filters 101–103 and clear layer 104, which do overlap the address lines.

Referring now to FIGS. 1–11, it will be described how AMLCD 2 including the array of TFT structures and corresponding address lines is made or manufactured according to one embodiment of this invention. First, substantially transparent active substrate 19 is provided. Next, a gate metal layer or sheet (which results in gate electrodes 17) is deposited on the top surface (the surface which faces the liquid crystal layer) of substrate 19 to a thickness of from about 1,000–5,000 Å, most preferably to a thickness of about 2,500 Å. The gate metal sheet is deposited by way of sputtering or vapor deposition. The gate metal may be of tantalum (Ta) according to certain embodiments of this invention. Insulating substrate 19 may be of glass, quartz, sapphire, or the like.

The structure including active substrate 19 and the deposited gate metal is then patterned by photolithography to the desired gate electrode 17 and gate address line 7 configuration. The upper surface of the gate metal is exposed in a window where the photoresist has not been retained.

The gate metal (e.g. Ta) layer is then dry etched (preferably using reactive ion etching or RIE) in order to pattern the gate metal layer in accordance with the retained photoresist pattern. To do this, the structure is mounted in a known RIE apparatus which is then purged and evacuated in accordance with known RIE procedures and etchants. This etching of the gate metal layer is preferably carried out until the gate metal is removed in center areas of the window and is then permitted to proceed for an additional time (e.g. 20 to 40 seconds) of overetching to ensure that the gate metal is entirely removed from within the windows. The result is the gate address lines 7 (and gate electrodes 17) being left on active substrate 19. In the FIG. 6 embodiment, the gate electrode 17 are formed as extensions which protrude from the gate lines 7, while in FIGS. 1 and 4 the gate electrodes are part of the actual gate lines 7.

Figure 7:
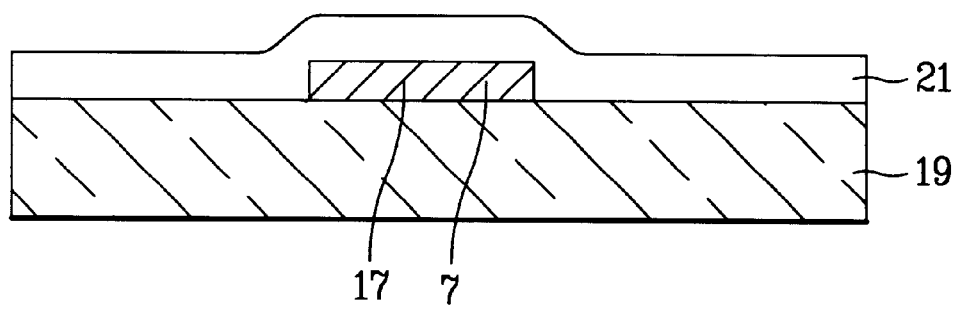

After address lines 7 and electrode 17 are deposited and patterned on top of substrate 19, gate insulating or dielectric layer 21 is deposited over substantially the entire substrate 19 preferably by plasma enhanced chemical vapor deposition (CVD) or some other process known to produce a high integrity dielectric. The resulting structure is shown in FIG. 7. Gate insulating layer 21 preferably includes silicon nitride but may also include silicon dioxide or other known dielectrics. Silicon nitride has a dielectric constant of about 6.4. Gate insulating layer 21 is deposited to a thickness of from about 2,000–3,000 Å (preferably either about 2,000 Å or 3,000 Å) according to certain embodiments.

It is noted that after anodization (which is optional), gate Ta layer 17 which was deposited as the gate electrode 17 and gate line 7 layer (when originally about 2,500 Å thick) is about 1,800 Å thick and a newly created $Ta_2O_5$ layer is about 1,600 Å. Anodization takes place after the gate line patterning and before further processing. Thus, gate insulating layer 21 over gate lines 7 and electrodes 17 is made up of both the anodization created $Ta_2O_5$ layer and the silicon nitride layer. Other metals from which gate electrode 17 and address lines 7 may be made include Cr, Al, titanium, tungsten, copper, and combinations thereof.

Figure 8:
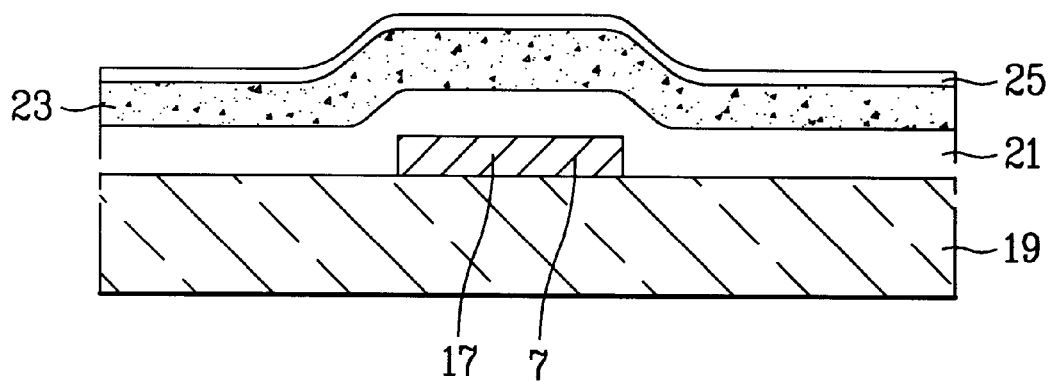

After gate insulating layer 21 has been deposited, semiconductor (e.g. intrinsic a-Si) layer 23 is deposited on top of gate insulating layer 21 to a thickness of about 2,000 Å (see FIG. 8). Semiconductor 23 may be from about 1,000 Å to 4,000 Å thick in certain embodiments of this invention. Then, doped (typically phosphorous doped, that is n+) amorphous silicon contact layer 25 is deposited over intrinsic a-Si layer 23 in a known manner as shown in FIG. 8 to a thickness of, for example, about 500 Å. Doped contact layer 25 may be from about 200 Å–1,000 Å thick according to certain embodiments of this invention.

Gate insulating layer 21, semiconductor layer 23 and semiconductor contact layer 25 may all be deposited on substrate 19 in the same deposition chamber without breaking the vacuum in certain embodiments. When this is done, the plasma discharge in the chamber is stopped after the completion of the deposition of a particular layer (e.g. insulating layer 21) until the proper gas composition for deposition of the next layer (e.g. semiconductor layer 23) is established. Subsequently, the plasma discharge is re-established to deposit the next layer. Alternatively, layers 21, 23, and 25 may be deposited in different chambers by any known method.

Following the formation of the FIG. 8 structure, the TFT island or area may be formed by way of etching, for example, so that the TFT metal layers can be deposited thereon. Optionally, one of the TFT metal source/drain layers may be deposited before forming the island.

Figure 9:
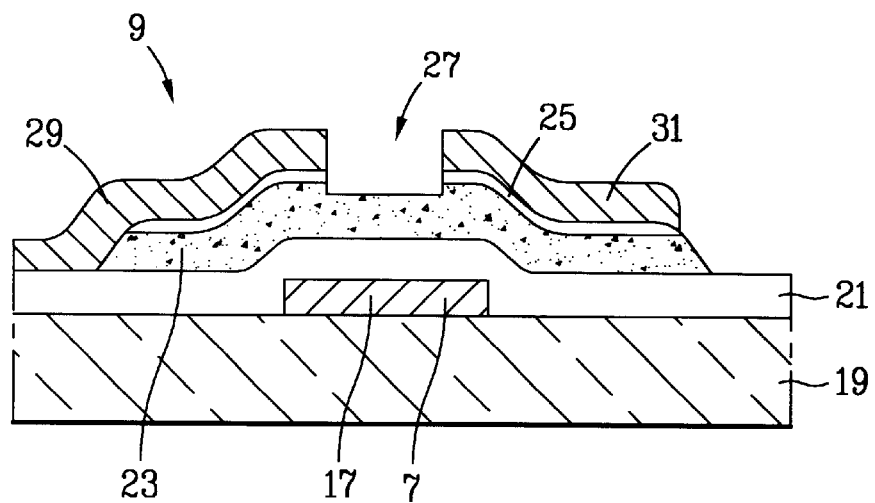
Figure 10:
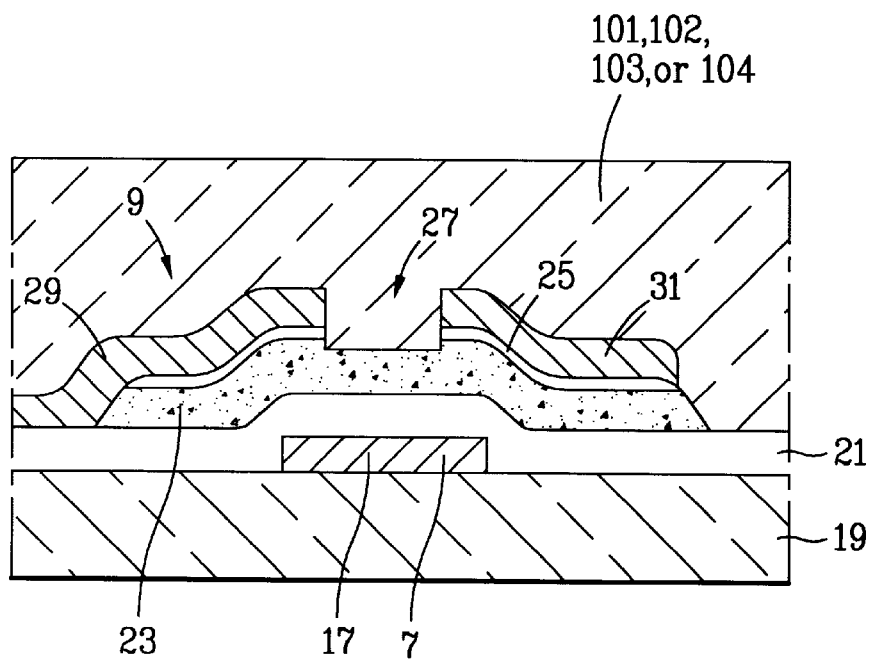

According to certain embodiments, following the formation of the TFT island from the FIG. 8 structure, a source-drain metal sheet or layer (which results in drain metal layer 29 and source layer 31) is deposited on substrate 19 over top of semiconductor layer 23 and contact layer 25. The result is TFT structure 9 with channel 27 (after patterning) is shown in FIG. 9.

Red color filter insulating layer 101 is then deposited onto substantially the entire substrate 19 by way of spin coating or printing according to certain embodiments of this invention. Layer 101 may be, for example, of red pigment or red dye inclusive photo-imageable material in certain embodiments. Layer 101 fills recesses generated upon formation of TFTs 9 and flattens the surface above substrate 19 at least about 60% according to certain embodiments.

The photo-imageable color filter layer 101 acts as a negative resist layer according to certain embodiments of this invention so that no additional photoresist is needed to pattern the layer 101 into the array of red color filters 101 and to form vias 35 and/or 36 in the layer. In order to pattern layer 101 and form vias 35 and/or 36, the layer is irradiated by ultraviolet (UV) rays (e.g. I-line of 365 nm), with UV irradiated areas of layer 101 remaining on the substrate and non-exposed or non-radiated areas of the layer being removed during developing. A mask may optionally be used. Thus, the areas of the negative resist 101 corresponding to the vias and areas to be removed are not exposed to the UV radiation, while the rest of the layer which will result in the color filters is exposed to UV.

Following exposure of layer 101, the layer is developed by using a known developing solution at a known concentration. In the developing stage, the areas of layer 101 corresponding to vias 35 and/or 36 and the remainder of the active area where the filter is not to be present are removed (i.e. dissolved) so as to pattern the red color filters 101 on the active substrate and form vias 35 and/or 36 in same. After developing, the resist layer 101 is cured or subjected to post-baking (e.g. about 240° C. for about one hour) to eliminate the solvent so that the layer therein is resinified. Thus, no dry or wet etching is needed to form the vias and pattern layer 101 into the plurality of color filters 101 which take the form of strips in the FIG. 6 embodiment, and the form of squares in the FIG. 1 embodiment. According to alternative embodiments, layer 101 may be a positive resist as opposed to a negative resist in photo-imageable embodiments. Alternatively, the color filter layers may be non-photo-imageable in some embodiments.

Vias or contact holes 35 are thus formed in insulation color filters 101 over top of, or adjacent, each source metal electrode 31 so as to permit the corresponding pixel electrodes 3 to electrically contact corresponding source electrodes 15 through vias 35 in the red color filters 101. The color filters remains across the entire area of each red pixel and each overlaps at least one of the adjacent address lines as shown in FIG. 1.

After the red color layer 101 is formed and patterned on active substrate 19 as discussed above, the green and blue color filter layers 102 and 103, respectively, are formed on the substrate 19 and patterned in the same manner so as to form the arrays of green and blue color filters 102 and 103 in the green and blue pixel areas of the AMLCD. The green and blue color filters 102 and 103 are formed and provided on the substrate in a manner similar to the red color filters 101 discussed above. Other clear strips 104 may be formed and patterned on substrate 19 in a similar manner if white pixels are desired. Optionally, the red color filters do not have to be formed first. For example, the color filters could be formed in the following order: green, blue, and red; or blue, green, and red. Any order may suffice.

After all color filters are formed and patterned on substrate 19, a substantially transparent conducting layer (e.g. ITO) which results in pixel electrodes 3 is deposited and patterned (e.g. photo-masked and etched) on substrate 19 over top of the color filters. After patterning (e.g. mask and etching) of this substantially transparent conducting layer, pixel electrodes 3 are left as shown in FIGS. 1, 3, 4, 5, and 6. As a result of the vias or contact holes 35 formed in the color filters, each pixel electrode 3 contacts a corresponding TFT source electrode 31. When contact holes 36 are provided, each pixel electrode 3 contacts a storage capacitor electrode 12. The result is the active plate of FIGS. 1, 4, and 6, including an array of TFTs. The pixel electrode layer, when made of ITO, is deposited to a thickness of from about 300 Å to 900 Å (preferably about 600 Å) according to certain embodiments of this invention. Other known materials may be used as pixel electrode layer 3.

The instant inventors have found surprisingly that the thickness of the metal pixel electrode layer (and pixel electrodes 3) should be from about 300 Å–900 Å in this invention, because of the need to reduce the interface stress between the pixel electrodes (e.g. ITO) and materials 101–104.

Figure 5:
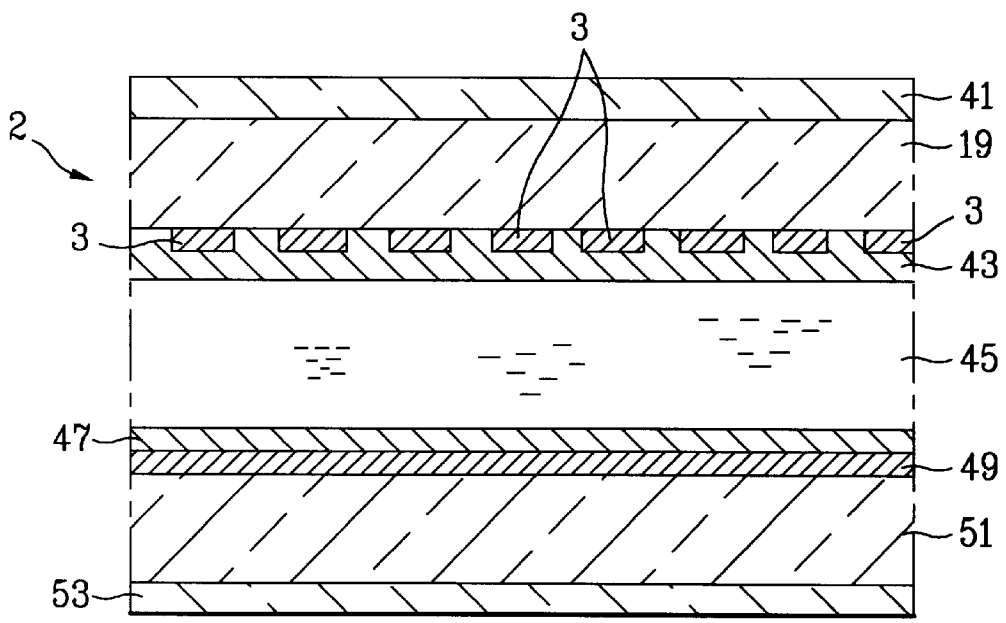
FIG. 5 is a side elevational cross-sectional view of the AMLCD of FIGS. 1 and 4, except that this figure does not illustrate the insulating color filters or TFTs.

After formation of the active plate, liquid crystal layer 45 is disposed and sealed between the active plate and the passive plate as shown in FIG. 5. The passive plate includes substrate 51, polarizer 53, common electrode 49, and orientation film 47. Meanwhile, the active plate includes thereon polarizer 41, orientation film 43, and the structure illustrated in FIGS. 1, 4, and 6 (noting that FIGS. 4 and 6 are different embodiments).

As shown in FIGS. 1, 6(a), 6(b), and 6(c), the pixel electrodes 3 and the color filters 101–103 (and layer 104) are patterned to a size so that they overlap both drain address lines 5 and gate address lines 7 along the edges thereof so as to result in an increased pixel aperture ratio for AMLCD 2. The cross-talk problems of the prior art are substantially eliminated due to the presence of the color filters in overlap areas 18 between the pixel electrodes and address lines. Alternatively, the pixel electrodes need only overlap one group of address lines (e.g. column lines) according to certain embodiments.

FIG. 5 is a side cross-sectional view of AMLCD 2 (of FIG. 1 or of FIG. 6), absent the TFTs, color filters, address lines, etc. As shown, the twisted nematic display includes from the rear forward toward the viewer, rear polarizer 41, substantially transparent active substrate 19, pixel electrodes 3, rear orientation film 43, twisted nematic liquid crystal layer 45, front orientation film 47, common electrode 49, front substantially transparent substrate (passive substrate) 51, and finally front polarizer 53. Optionally, patterned black matrix/anti-refractive layer may be inserted between substrate 51 and common electrode 49 in order to reduce the possible refraction and/or reflection from the uncovered address lines, and shield TFTs from ambient light. Alternatively, a black matrix may be provided on address lines and TFTs before deposition of any polymer material is provided (i.e. on the active plate). Polarizers 41 and 53 may be arranged so that their transmission axes are either parallel or perpendicular to each other so as to define a normally black or normally white colored AMLCD respectively. Optionally, retarders may also be provided between 19 and polarizer 41 and/or 51 and polarizer 53.

Typically, a backlight is provided rearward of polarizer 41 so that light emitted therefrom first goes through polarizer 41, then through LC layer 45, and out of polarizer 53 toward the viewer. Pixel electrodes 3 selectively work in conjunction with common electrode 49 so as to selectively apply voltage across LC layer 45 in different pixels so as to cause an image to be viewed from the front of the display.

Exemplary line pixel capacitance values according to this invention range from about 4.5 to 10.0 fF when the overlap distance is from about 1–2 μm. Compare these values with a conventional coplanar LCD in which the pixel electrodes are substantially coplanar with the address lines and spaced therefrom, such a conventional LCD having a line pixel capacitance of about 11.8 fF when the electrodes are spaced laterally from the address lines by about 5 μm, and about 9.6 fF when the lateral spacing is about 10 μm. Thus the high aperture LCDs discussed herein have higher pixel aperture ratios than conventional LCDs without suffering from substantially higher line pixel capacitance values. The capacitance values herein takes into consideration the fringing capacitance in a known manner.

The line pixel capacitance is less than about 20 fF, preferably less than or equal to about 12 fF, and most preferably less than or equal to about 7.0 fF according to this invention with the overlapped areas and high pixel apertures.

The line-pixel capacitance values (and insulating materials) of this invention are similar to those disclosed in Chart 1 of U.S. Pat. No. 5,641,974, the disclosure of which is incorporated herein by reference.

The color filters disclosed herein have transmission characteristics so that the pixels and LCD having viewing characteristics (e.g. contrast ratios and inversion characteristics) as described in U.S. Pat. Nos. 5,594,568 and 5,570,214 when the retarder configurations claimed therein are used, the disclosures of which are hereby incorporated herein by reference.

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. A color liquid crystal display including color filters, the liquid crystal display comprising:

first and second substrates;

a liquid crystal layer sandwiched between said first and second substrates;

first and second colored pixels, said first pixel including a first pixel electrode, a first insulating color filter, and a first switching element, and said second pixel including a second pixel electrode, a second insulating color filter, and a second switching element, wherein said first and second color filters are differently colored;

said first pixel electrode overlapping at least one address line in communication with said first switching element, and said second pixel electrode overlapping at least one address line in communication with said second switching element, so as to define a high aperture display, said overlapping by said first and second pixel electrodes forming areas of overlap;

said first color filter being at least partially disposed in an area of overlap formed by said first pixel electrode and said first color filter having a dielectric constant of less than about 5.0 and a first contact hole defined therein that allows said first pixel electrode to be in electrical communication with said first switching element; and said second color filter being at least partially disposed in an area of overlap formed by said second pixel electrode, and said second color filter having an dielectric constant of less than about 5.0 and a contact hole defined therein that allows said second pixel electrode to be in electrical communication with said second switching element.

2. The display of claim 1, wherein each of said first and second color filters comprises photo-imageable material.

3. The display of claim 2, wherein each of said first and second color filters comprises a negative resist.

4. The display of claim 1, wherein each of said first and second color filters has a refractive index of from about 1.5 to 2.0.

5. The display of claim 1, wherein each of said first and second color filters has a thickness of from about 1.5–2.5 $\mu$m, and wherein the pixel aperture ratio of the display is at least about 68%.

6. A liquid crystal display device comprising:

a substrate having a pixel region;

first and second address lines defining the pixel region;

a switching device having an electrode on the substrate;

a first color filter on the switching device and the substrate, the first color filter covering the pixel region, the first color filter having a contact hole adjacent a portion of the switching device;

a pixel electrode contacting the electrode of the switching device through the contact hole; and a second color filter adjacent the first color filter and partially overlapping the first address line, the second color filter being spaced from the first color filter.

7. The liquid crystal display device according to claim 6, wherein the second color filter is spaced from the first color filter by about 0.5 $\mu$m to 2.0 $\mu$m.

8. The liquid crystal display device according to claim 6, wherein the second color filter is spaced from the first color filter by more than 0.5 $\mu$m.

9. A liquid crystal display device comprising:

a first substrate having first, second and third pixel regions;

address lines defining the first, second and third pixel regions;

first, second and third thin film transistors in corresponding first, second and third pixel regions on the substrate, each of the first, second and third thin film transistors having a gate electrode, a source electrode and a drain electrode;

first, second and third color filters covering corresponding first, second and third thin film transistors and the corresponding first, second and third pixel regions, the first second and third color filters each having a contact hole adjacent one of the source and drain electrodes of a corresponding one of the first, second and third thin film transistors; and first, second and third pixel electrodes contacting corresponding first, second and third thin film transistors through the contact hole of each of the first, second and third color filters, wherein the first, second and third color filters are spaced from each other.

10. The liquid crystal display device according to claim 9, wherein the first, second and third color filters are spaced from each other by about 0.5 $\mu$m to 2.0 $\mu$m.

11. The liquid crystal display device according to claim 9, wherein the first, second and third color filters are spaced from each other by more than 0.5 $\mu$m.

* * * * *